(12) United States Patent
Nayfeh

(10) Patent No.: US 9,190,509 B2
(45) Date of Patent: Nov. 17, 2015

(54) HIGH MOBILITY, THIN FILM TRANSISTORS USING SEMICONDUCTOR/INSULATOR TRANSITION-METAL DICHALCOGENIDE BASED INTERFACES

(71) Applicant: U.S. Army Research Laboratory, Adelphi, MD (US)

(72) Inventor: Osama M. Nayfeh, Adelphia, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 312 days.

(21) Appl. No.: 13/792,332

(22) Filed: Mar. 11, 2013

(65) Prior Publication Data

US 2014/0252415 A1    Sep. 11, 2014

(51) Int. Cl.
| | |
|---|---|
| H01L 29/16 | (2006.01) |
| H01L 29/778 | (2006.01) |
| H01L 29/66 | (2006.01) |
| H01L 29/49 | (2006.01) |
| H01L 29/786 | (2006.01) |

(52) U.S. Cl.
CPC ........ *H01L 29/7789* (2013.01); *H01L 29/1606* (2013.01); *H01L 29/4908* (2013.01); *H01L 29/66431* (2013.01); *H01L 29/78603* (2013.01); *H01L 29/78681* (2013.01); *H01L 29/78696* (2013.01)

(58) Field of Classification Search
CPC .............................. H01L 35/16; H01L 29/772
USPC .................. 257/29; 423/290; 428/81
See application file for complete search history.

(56) References Cited

U.S. PATENT DOCUMENTS

2013/0140526 A1*  6/2013  Kim et al. .............. 257/29

OTHER PUBLICATIONS

Coleman et al., "Two-Dimensional Nanosheets Produced by Liquid Exfoliation of Layered Materials", Science 331, 568 (2011).*
Kharche et al., "Quasiparticle Band Gap Engineering of Graphene and Graphone on Hexagonal Boron Nitride Substrate", Nano Lett. 2011, 11, 5274-5278.*

* cited by examiner

*Primary Examiner* — Thomas L Dickey
(74) *Attorney, Agent, or Firm* — Eric B. Compton

(57) ABSTRACT

Electronic devices and methods of forming an electronic device are disclosed herein. An electronic device may include a first 2D atomic crystal layer; a second 2D atomic crystal layer disposed atop the first 2D atomic crystal layer; and an interface comprising van-der-Waals bonds between the first 2D atomic crystal layer and the second 2D atomic crystal layer. A method of forming an electronic device may include depositing a first 2D atomic crystal layer; and depositing a second 2D atomic crystal layer atop the first 2D atomic crystal layer; wherein an interface is formed between the first 2D atomic crystal layer and the second 2D atomic crystal layer via van-der-Waals bonding.

18 Claims, 3 Drawing Sheets

HIGH MOBILITY, THIN FILM TRANSISTORS USING SEMICONDUCTOR/INSULATOR TRANSITION-METAL DICHALCOGENIDE BASED INTERFACES

GOVERNMENT INTEREST

Governmental Interest—The invention described herein may be manufactured, used and licensed by or for the U.S. Government without the payment of royalties thereon.

FIELD OF INVENTION

Embodiments of the present invention generally relate to semiconductor devices, and more particularly, to field effect devices, such as thin film transistors, and the manufacturer thereof.

BACKGROUND OF THE INVENTION

Field effect devices, such as thin film transistors are an important component in a variety of electronic systems. However, the usage of thin film transistors is limited by the use of organic, amorphous silicon, and mixed oxide thin films in the formation of thin film transistors. The use of such materials results in dangling bonds from, for example, silicon atoms, which can trap charges, thereby reducing the density of mobile charge carriers and adversely affecting the performance of the thin film transistors. Specifically, a thin film transistor using such materials has a carrier mobility that is too low (e.g., less than 10 cm$^2$/Vs) for certain high performance applications.

Therefore, the inventors have provided an improved field effect device and method for forming a field effect device.

BRIEF SUMMARY OF THE INVENTION

Embodiments of the present invention relate to an electronic device which may include a first 2D atomic crystal layer; a second 2D atomic crystal layer disposed atop the first 2D atomic crystal layer; and an interface comprising van-der-Waals bonds between the first 2D atomic crystal layer and the second 2D atomic crystal layer.

Embodiments of the present invention relate to a method of forming an electronic device which may include depositing a first 2D atomic crystal layer; and depositing a second 2D atomic crystal layer atop the first 2D atomic crystal layer, wherein an interface is formed between the first 2D atomic crystal layer and the second 2D atomic crystal layer via van-der-Waals bonding.

Embodiments of the present invention relate to a thin film transistor which may include a substrate; a plurality of 2D atomic crystal layers formed atop the substrate, wherein the plurality of 2D atomic crystal layers comprise a 2D atomic crystal high-k insulator layer formed atop a 2D atomic crystal semiconductor layer; an interface between the 2D atomic crystal semiconductor layer and the 2D atomic crystal high-k insulator layer, wherein the interface comprises van-der-Waals bonds; a source electrode and a drain electrode disposed atop the 2D atomic crystal semiconductor layer in respective source and drain regions of the thin film transistor, wherein the source electrode and drain electrode define a channel region disposed between the source and drain regions; and a gate electrode disposed atop 2D atomic crystal high-k insulator layer.

Embodiments of the present invention relate to a method of forming a thin film transistor which may include depositing a first 2D atomic crystal layer atop a substrate; depositing a second 2D atomic crystal layer atop the first 2D atomic crystal layer; forming a source electrode and a drain electrode atop the second 2D atomic crystal layer in respective source and drain regions of the thin film transistor, wherein the source electrode and drain electrode define a channel region disposed between the source and drain regions; depositing a third 2D atomic crystal layer atop the second 2D atomic crystal layer over the channel region and between the source and drain regions, wherein an interface between the third 2D atomic crystal layer atop the second 2D atomic crystal layer bonds the third 2D atomic crystal layer to the second 2D atomic crystal layer via van-der-Waals bonding; and depositing a gate electrode atop the third 2D atomic crystal layer.

Other and further embodiments of the invention are described in more detail, below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Embodiments of the present invention include improved semiconductor/insulating interface structure formed of 2D atomic crystal layers. Such a structure may be used, for example in field effect devices, such as thin film transistors. Other embodiments include methods for forming such a structure and, in more particularly for forming improved field effect devices, such as thin film transistors.

Devices in accordance with embodiments of the present invention advantageously provide one or more of greater carrier mobility, lower power consumption due to reduction in leakage current, high temperature stability (e.g., up to 1,100° C.) and lower cost especially compared to crystalline silicon. For instance, a 10×-20× greater mobility (e.g., up to and greater than 500 cm$^2$/Vs) and up to 2 orders of magnitude lower power consumption due to the reduction in leakage current may be realized.

Figure 1:
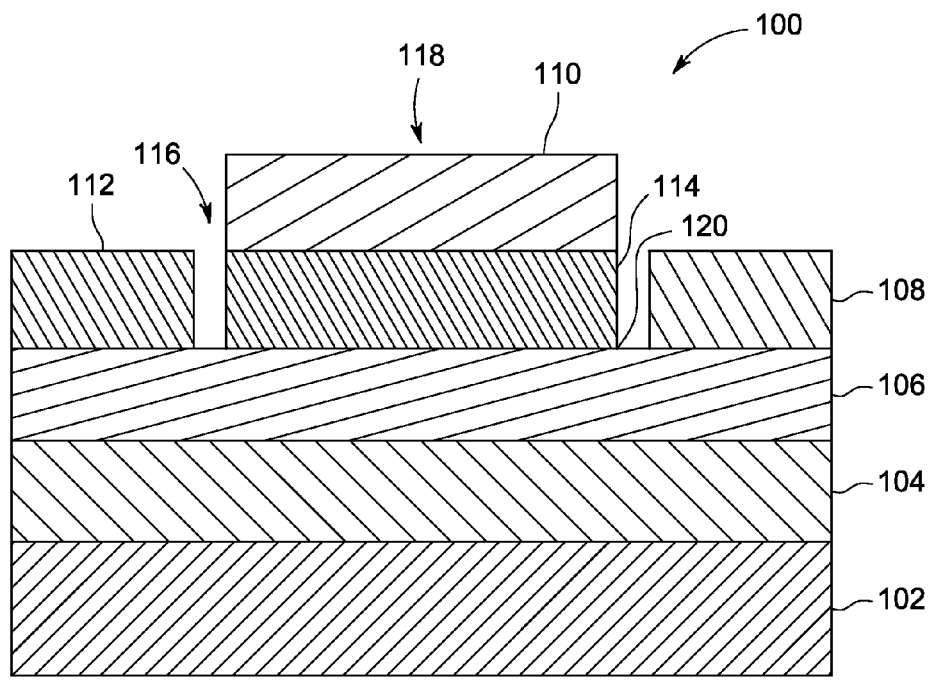
FIG. 1 depicts a schematic diagram of a thin film transistor in accordance with some embodiments of the present invention.

FIG. 1 depicts a thin film transistor 100 in accordance with some embodiments of the present invention. The thin film transistor 100 comprises a substrate 102. The substrate 102 may be any suitable dielectric or semiconductor material. In some embodiments, the substrate 102 can be silicon, glass, or plastic.

As used herein, a 2D atomic crystal layer refers to one or more individual crystalline atomic planes produced either from a bottom-up synthesis process (e.g. Van-der-Waals epitaxial growth) or extracted/cleaved from constituent bulk crystals. In some embodiments, an individual crystalline atomic plane may be cleaved from a bulk homogeneous crystal structure, or it may be cleaved from a heterogeneous crystal structure synthesized using artificial crystal synthesis techniques that are known to persons skilled in the art. The cleaving process may be done, for example, by mechanical exfoliation and/or chemical exfoliation techniques that are known to persons skilled in the art.

These planes together form a generally two-dimensional (2D) structure defined in the x- and y-directions, but have a very small depth defined in the z-direction relative to its dimensions in the x-y plane (i.e., $D_x, D_y >> D_z$). In some embodiments, certain 2D atomic crystals, for example, certain transition metal dichalcogenides described below, or boron nitride (BN) or bismuth selenide ($Bi_2Se_3$), form an electrically insulating structure. In some embodiments, certain 2D atomic crystals, for example, certain transition metal dichalcogenides described below, or graphene, or magnesium diboride ($MgB_2$) form a semiconducting structure. As used herein, a transition metal dichalcogenide has the general formula $TX_2$, where T is a transition metal and X is a chalcogenide. Examples of electrically insulating transition metal dichalcogenides include, but are not limited to hafnium disulfide ($HfS_2$), zirconium disulfide ($ZrS_2$) or the like. Examples of semiconducting transition metal dichalcogenides include but are not limited to molybdenum disulfide ($MoS_2$), tungsten disulfide ($WS_2$), niobium disulfide ($NbS_2$), tantalum disulfide ($TaS_2$), vanadium disulfide ($VS_2$), rhenium disulfide ($ReS_2$), tungsten selenide ($WSe_2$), molybdenum selenide ($MoSe_2$), niobium selenide ($NbSe_2$), or the like. Typically, transition metal dichalcogenides having group IV-A and VI-A transition metals (e.g. Mo, Hf, W) exhibit superconducting, semiconducting or insulating properties, depending on the band-gap of the material. The unfilled transition-metal d-band determines the band-gap, the dielectric constant, and mobility of the transition metal dichalcogenides.

In addition, it should be appreciated that the use of the ordinal terms (i.e., first, second, third, etc.) herein is solely for ease in discussing and referring to similar elements, with "first" being used initially to describe an element, and further elements being referred to by the next and subsequent ordinal term (e.g., second, third, etc.) as used. Their use should not to be construed as limiting. Indeed, the number of similar elements and thus the reference thereto may vary in different embodiments.

Atop the substrate 102 is a first 2D atomic crystal layer 104. The first 2D atomic crystal layer 104 is an insulator layer disposed between the substrate 102 and a second 2D atomic crystal layer 106, discussed below. The first 2D atomic crystal layer 104 acts as a barrier layer between the substrate 102 and the second 2D atomic crystal layer 106. In some embodiments, the first 2D atomic crystal layer 104 is a high dielectric constant ("high-k") insulator layer. In some embodiments, the high-k insulator layer has a high-k value between 10-40 $\epsilon_o$. In some embodiments, the high-k insulator layer has a high k-value above 40 $\epsilon_o$. The thickness of the first 2D atomic crystal layer 104, as well as the other 2D atomic crystal layers discussed below, can be single layer, double layer, or triple-layer thickness.

In some embodiments, the first 2D atomic crystal layer 104 is an electrically insulating transition metal dichalcogenide, such as hafnium disulfide ($HfS_2$) or zirconium disulfide ($ZrS_2$). Hafnium disulfide ($HfS_2$) has a dielectric value of 9-12 $\epsilon_o$. Zirconium disulfide ($ZrS_2$) has a dielectric value of 10-15 $\epsilon_o$. In some embodiments, the first 2D atomic crystal layer 104 is an electrical insulator such as boron nitride (BN) or bismuth selenide ($Bi_2Se_3$).

A second 2D atomic crystal layer 106 is disposed atop the first 2D atomic crystal layer 104. The second 2D atomic crystal layer 106 is a semiconductor layer. In some embodiments, the second 2D atomic crystal layer 106 is a semiconducting transition metal dichalcogenide, such as molybdenum disulfide ($MoS_2$), tungsten disulfide ($WS_2$), niobium disulfide ($NbS_2$), tantalum disulfide ($TaS_2$), vanadium disulfide ($VS_2$), rhenium disulfide ($ReS_2$), tungsten selenide ($WSe_2$), or molybdenum selenide ($MoSe_2$). In some embodiments, the second 2D atomic crystal layer 106 is a semiconductor such as graphene, or magnesium diboride ($MgB_2$), or nickel dichloride ($NiCl_2$), or vanadium oxide ($V_2O_5$).

A source electrode 112, a drain electrode 108, and a gate structure 118 are disposed atop the second 2D atomic crystal layer 106. The source electrode 112 and drain electrode 108 are each formed in respective source and drain regions of the thin film transistor 100. In some embodiments, the source electrode 112 and the drain electrode 108 are made of suitable conductive materials, such as metals (e.g., silver, gold, copper, or aluminum). The source electrode 112 and drain electrode 108 define a channel region 116 disposed between the source and drain regions. The source electrode 112 and drain electrode provide electrical connections to the channel region 116. The channel region 116 is etched from a portion of the second 2D atomic crystal layer 106.

The gate structure 118 comprises a third 2D atomic crystal layer 114 and a gate electrode 110. The third 2D atomic crystal layer 114 is disposed over the channel region 116 between the source and drain regions. The third 2D atomic crystal layer 114 is an insulator layer having a high-k value, as described above with respect to the first 2D atomic crystal layer 104. The high-k nature of the insulator layer advantageously minimizes charge carrier scattering, which can degrade charge carrier mobility. In some embodiments, the third 2D atomic crystal layer 114 is an electrically insulating transition metal dichalcogenide such as hafnium disulfide ($HfS_2$) or zirconium disulfide ($ZrS_2$). In some embodiments, the first 2D atomic crystal layer 104 is an electrical insulator such as boron nitride (BN) or bismuth selenide ($Bi_2Se_3$). The gate electrode 110 is disposed atop the third 2D atomic crystal layer 114. In some embodiments, the gate electrode 110 is made of metal, such as titanium, nickel, chromium, silver, gold, copper, or aluminum.

In some embodiments, a van-der-Waals epitaxial deposition process is used to deposit the third 2D atomic crystal layer 114 atop the second 2D atomic crystal layer 106 resulting in an interface 120 between the third 2D atomic crystal layer 114 and the second 2D atomic crystal layer 106. The interface 120 between the two atomic crystal layers 106, 114 comprises van-der-Waals forces bonding the two atomic crystal layers 106, 114 together.

Figure 2:
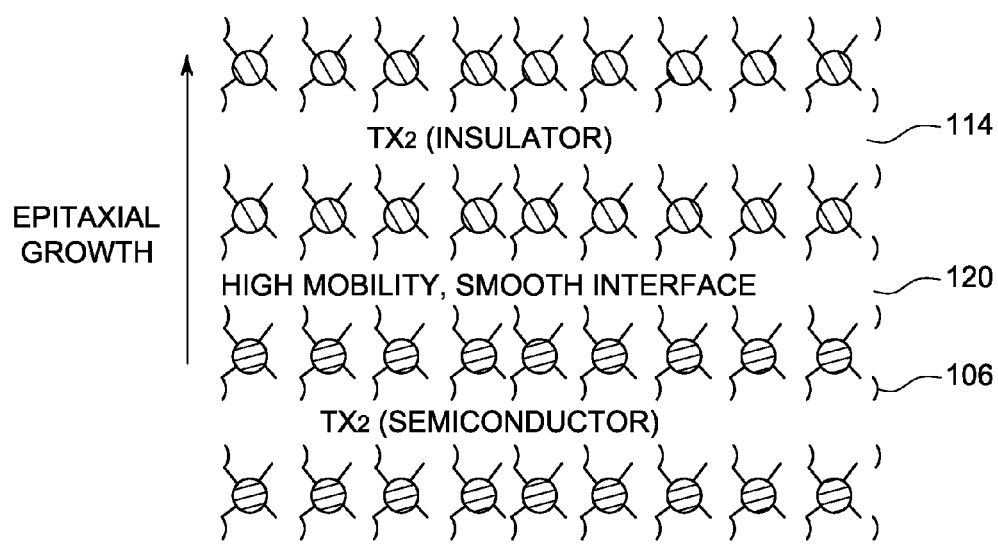
FIG. 2 depicts a schematic diagram of the interface between the second 2D atomic crystal layer and the third 2D atomic crystal layer of a thin film transistor in accordance with some embodiments of the present invention.

As depicted in FIG. 2, van-der-Waals forces at the interface 120 between the two atomic crystal layers 114, 106 result in the absence, or substantial absence of dangling chemical bonds between the two atomic crystal layers 106, 114. The absence of dangling bonds advantageously eliminates, or substantially eliminates, carrier charges becoming trapped by dangling bonds at the interface of the two atomic crystal layers 106, 114, thereby enabling the thin film transistor 100 to have higher charge carrier mobility.

Figure 3:
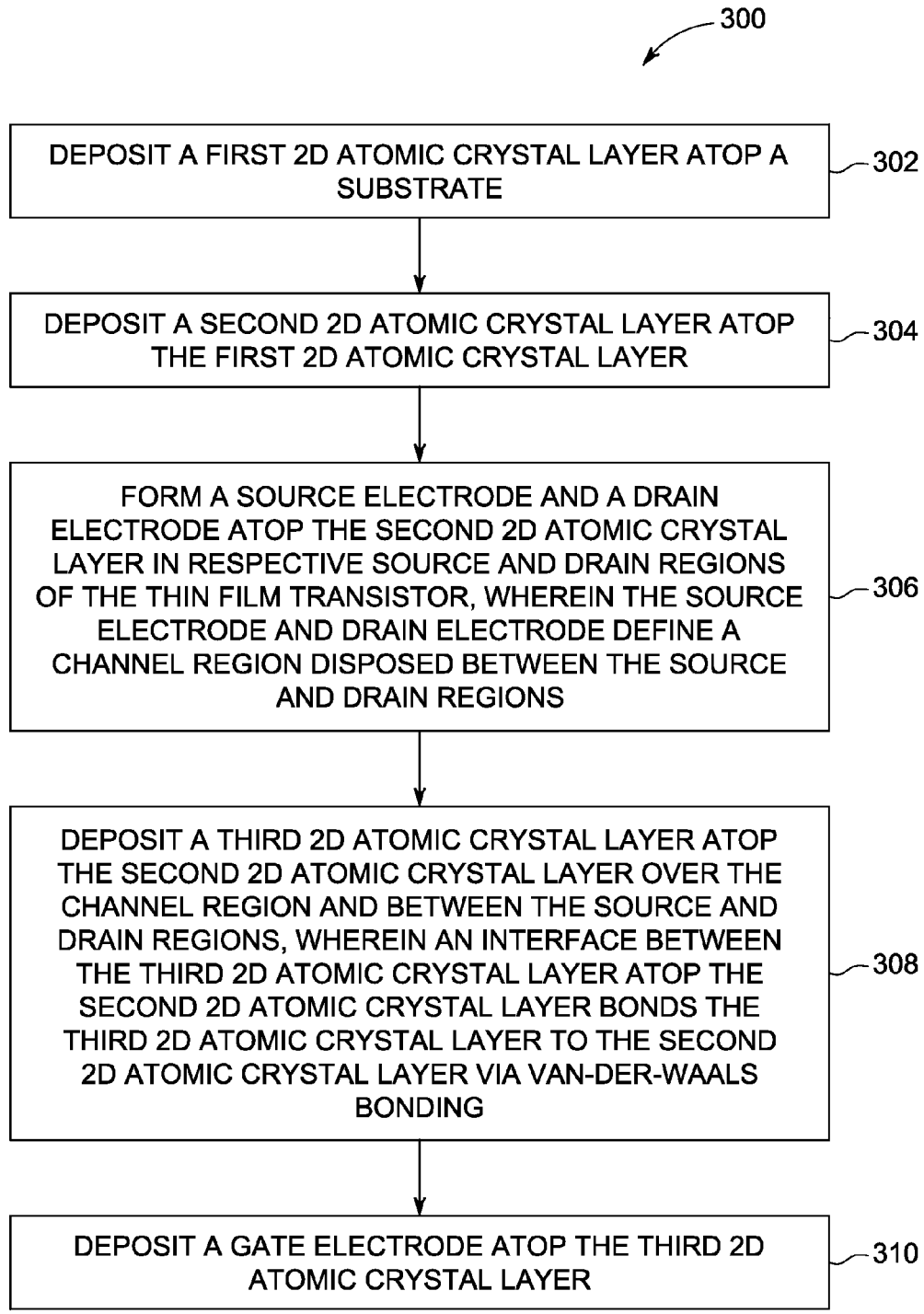
FIG. 3 depicts a flow chart of a method of forming a thin film transistor in accordance with some embodiments of the present invention.

FIG. 3 depicts a flow chart of a method 300 of forming thin film transistors in accordance with the embodiments described above. The method 300 is described below in accordance with a series of fabrication steps illustrated in FIGS. 4A-4E. In some embodiments, the method 300 may be performed in any suitable epitaxial deposition chamber, such as a molecular beam epitaxy chamber.

Figure 4A:
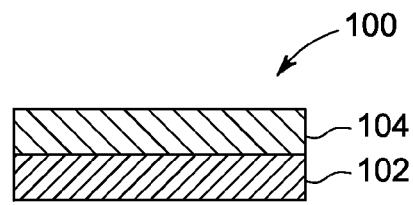
FIGS. 4A-4E depict the stages of fabrication of a thin film transistor in accordance with some embodiments of the present invention.
Figure 4B:
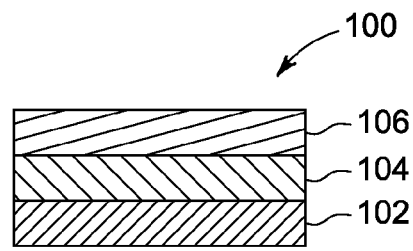

The method 300 begins at 302 where the first 2D atomic crystal layer 104 is deposited atop the substrate 102, as depicted in FIG. 4A. Next, at 304, the second 2D atomic crystal layer 106 is deposited atop the first 2D atomic crystal layer 104, as depicted in FIG. 4B. In some embodiments, the first 2D atomic crystal layer 104 and the second 2D atomic crystal layer 106 are deposited using a van-der-Waals epitaxial deposition process.

Figure 4C:
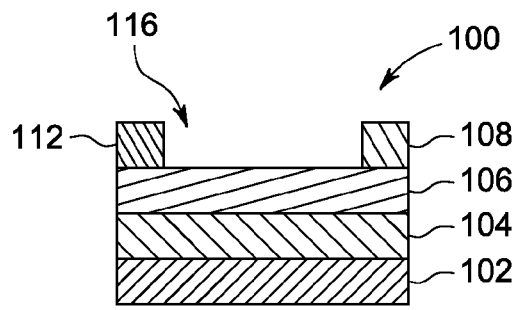

Next, at 306, a source electrode 112 and a drain electrode 108 are formed atop the second 2D atomic crystal layer in respective source and drain regions of the thin film transistor 100 as depicted in FIG. 4C. The source electrode 112 and drain electrode 108 define a channel region 116 disposed between the source electrode 112 and drain regions.

Figure 4D:
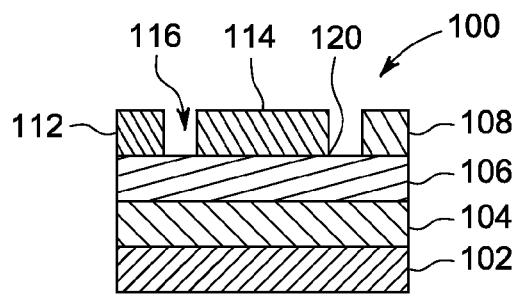
Figure 4E:
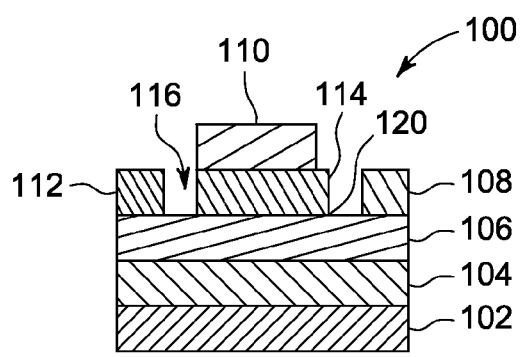

Next, at 308, a third 2D atomic crystal layer 106 is deposited atop the second 2D atomic crystal layer 106, as depicted in FIG. 4D. In some embodiments, the third 2D atomic crystal layer 106 is also deposited using a van-der-Waals epitaxial deposition process. The van-der-Waals epitaxial deposition process forms an interface 120 between the third 2D atomic crystal layer 114 and the second 2D atomic crystal layer 106. The interface 120 comprises van-der-Waals forces bonding the third 2D atomic crystal layer 114 to the second 2D atomic crystal layer 106. The van-der-Waals forces at the interface 120 result in the absence, or substantial absence of dangling chemical bonds between the two atomic crystal layers 106, 114 which advantageously eliminates, or substantially eliminates, the trapping of carrier charges by the dangling bonds, thereby enabling the thin film transistor 100 to have higher charge carrier mobility. Next, at 310, a gate electrode 110 is deposited atop the third 2D atomic crystal layer 114 as depicted in FIG. 4E.

While the foregoing is directed to embodiments of the present invention, other and further embodiments of the invention may be devised without departing from the basic scope thereof.

The invention claimed is:

1. A thin film transistor, comprising:
   a substrate;
   a plurality of 2D atomic crystal layers formed atop the substrate, wherein the plurality of 2D atomic crystal layers comprise a 2D atomic crystal high-k insulator layer formed atop a 2D atomic crystal semiconductor layer;
   an interface between the 2D atomic crystal semiconductor layer and the 2D atomic crystal high-k insulator layer, wherein the interface comprises van-der-Waals bonds;
   a source electrode and a drain electrode disposed atop the 2D atomic crystal semiconductor layer in respective source and drain regions of the thin film transistor, wherein the source electrode and drain electrode define a channel region disposed between the source and drain regions; and
   a gate electrode disposed atop 2D atomic crystal high-k insulator layer,
   wherein the 2D atomic crystal high-k insulator layer comprises an electrically insulating transition metal dichalcogenide and the 2D atomic crystal semiconductor layer comprises a semiconducting transition metal dichalcogenide.

2. The transistor of claim 1, wherein the substrate is at least one of silicon, glass, or plastic.

3. The transistor of claim 1, further comprising another 2D atomic crystal layer between the first 2D atomic crystal layer and the substrate.

4. The transistor of claim 1, wherein the interface is devoid of, or substantially devoid of dangling bonds.

5. The transistor of claim 1, wherein the electrically insulating transition metal dichalcogenide and the semiconducting transition metal dichalcogenide each comprise a group IV-A or VI-A transition metal.

6. The transistor of claim 1, wherein the electrically insulating transition metal dichalcogenide comprises: hafnium disulfide ($HfS_2$) or zirconium disulfide ($ZrS_2$).

7. The transistor of claim 1, wherein the semiconducting transition metal dichalcogenide comprises: molybdenum disulfide ($MoS_2$), tungsten disulfide ($WS_2$), niobium disulfide ($NbS_2$), tantalum disulfide ($TaS_2$), vanadium disulfide ($VS_2$), rhenium disulfide (ReS2), tungsten selenide ($WSe_2$), molybdenum selenide ($MoSe_2$), or niobium selenide ($NbSe_2$).

8. A method of forming a thin film transistor, comprising:
   depositing a first 2D atomic crystal layer atop a substrate;
   depositing a second 2D atomic crystal layer atop the first 2D atomic crystal layer;
   forming a source electrode and a drain electrode atop the second 2D atomic crystal layer in respective source and drain regions of the thin film transistor, wherein the source electrode and drain electrode define a channel region disposed between the source and drain regions;
   depositing a third 2D atomic crystal layer atop the second 2D atomic crystal layer over the channel region and between the source and drain regions, wherein an interface between the third 2D atomic crystal layer atop the second 2D atomic crystal layer bonds the third 2D atomic crystal layer to the second 2D atomic crystal layer via van-der-Waals bonding; and
   depositing a gate electrode atop the third 2D atomic crystal layer,.
   wherein the first 2D atomic crystal layer and the third 2D atomic crystal layer comprise an electrically insulating transition metal dichalcogenide and the second 2D atomic crystal layer a semiconducting transition metal dichalcogenide.

9. The method of claim 8, wherein the first 2D atomic crystal layer is a high-k insulator layer.

10. The method of claim 8, wherein the first 2D atomic crystal layer is a semiconductor layer.

11. The method of claim 8, wherein the first, second and third 2D atomic crystal layers are individual crystalline atomic planes produced either from a bottom-up synthesis process or extracted/cleaved from constituent bulk crystals.

12. The method of claim 8, wherein the interface is devoid of, or substantially devoid of dangling bonds.

13. The method of claim 8, wherein the electrically insulating transition metal dichalcogenide and the semiconducting transition metal dichalcogenide each comprise a group IV-A or VI-A transition metal.

14. The method of claim 8, wherein the electrically insulating transition metal dichalcogenide comprises: hafnium disulfide ($HfS_2$) or zirconium disulfide ($ZrS_2$).

15. The method of claim 8, wherein the semiconducting transition metal dichalcogenide comprises: molybdenum disulfide ($MoS_2$), tungsten disulfide ($WS_2$), niobium disulfide ($NbS_2$), tantalum disulfide ($TaS_2$), vanadium disulfide ($VS_2$), rhenium disulfide ($ReS_2$), tungsten selenide ($WSe_2$), molybdenum selenide ($MoSe_2$), or niobium selenide ($NbSe_2$).

16. The method of claim 8, wherein the channel region is etched from a portion of the second 2D atomic crystal layer.

17. A field effect device, comprising:
a substrate;
a 2D atomic crystal high-k insulator layer comprising an electrically insulating transition metal dichalcogenide formed atop the substrate; and
a 2D atomic crystal semiconductor layer comprising a semiconducting transition metal dichalcogenide formed atop the first 2D atomic crystal high-k insulator layer,
wherein interfaces are formed between the 2D atomic crystal semiconductor layer and the 2D atomic crystal high-k insulator layer comprising van-der-Waals bonds.

18. A method of forming field effect device, comprising:
depositing a 2D atomic crystal high-k insulator layer comprising an electrically insulating transition metal dichalcogenide atop a substrate; and
depositing a 2D atomic crystal semiconductor layer comprising a semiconducting transition metal dichalcogenide atop the first 2D atomic crystal high-k insulator layer,
thereby forming interfaces between the 2D atomic crystal semiconductor layer and the 2D atomic crystal high-k insulator layer, wherein the interfaces comprises van-der-Waals bonds.

\* \* \* \* \*